(12) United States Patent
Suga et al.

(10) Patent No.: US 12,019,480 B2
(45) Date of Patent: Jun. 25, 2024

(54) ROLLABLE ELECTRONIC DEVICE WITH SLIT THAT SEPARATES TERMINAL PORTIONS

(71) Applicant: SHARP KABUSHIKI KAISHA, Sakai (JP)

(72) Inventors: Katsuyuki Suga, Sakai (JP); Yuki Yasuda, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 648 days.

(21) Appl. No.: 17/277,271

(22) PCT Filed: Sep. 28, 2018

(86) PCT No.: PCT/JP2018/036500
§ 371 (c)(1),
(2) Date: Mar. 17, 2021

(87) PCT Pub. No.: WO2020/065989
PCT Pub. Date: Apr. 2, 2020

(65) Prior Publication Data
US 2021/0358346 A1 Nov. 18, 2021

(51) Int. Cl.
  *H05B 33/06* (2006.01)
  *G06F 1/16* (2006.01)
  *G09F 9/30* (2006.01)
  *H10K 59/131* (2023.01)

(52) U.S. Cl.
  CPC ........... *G06F 1/1652* (2013.01); *H05B 33/06* (2013.01); *G09F 9/301* (2013.01); *H10K 59/131* (2023.02)

(58) Field of Classification Search
  CPC ....... H10K 59/82; H10K 59/179; H05B 33/06
  See application file for complete search history.

(56) References Cited

U.S. PATENT DOCUMENTS

| | | | |
|---|---|---|---|
| 9,098,241 B1 | 8/2015 | Cho et al. | |
| 2002/0173178 A1* | 11/2002 | Matsunaga | H05K 1/117 439/67 |
| 2014/0003022 A1* | 1/2014 | Lee | H05K 1/189 361/809 |
| 2016/0029474 A1 | 1/2016 | Cho et al. | |
| 2016/0360607 A1* | 12/2016 | Li | H05K 1/028 |
| 2017/0071066 A1 | 3/2017 | Cho et al. | |
| 2017/0196103 A1 | 7/2017 | Cho et al. | |
| 2017/0367198 A1* | 12/2017 | Park | H10K 50/84 |
| 2017/0371376 A1* | 12/2017 | Chung | G02F 1/133305 |
| 2018/0005568 A1 | 1/2018 | Kim et al. | |

FOREIGN PATENT DOCUMENTS

| | | |
|---|---|---|
| JP | 2016024460 A | 2/2016 |
| JP | 2017227863 A | 12/2017 |

* cited by examiner

*Primary Examiner* — Abdulmajeed Aziz
*Assistant Examiner* — Steven Y Horikoshi
(74) *Attorney, Agent, or Firm* — ScienBiziP, P.C.

(57) ABSTRACT

In a display panel, a first slit is formed between a first terminal portion and a second terminal portion that are two of a plurality of terminal portions, and the first slit separates the first terminal portion and the second terminal portion between the first terminal portion and the second terminal portion.

12 Claims, 6 Drawing Sheets

ROLLABLE ELECTRONIC DEVICE WITH SLIT THAT SEPARATES TERMINAL PORTIONS

TECHNICAL FIELD

The disclosure relates to a rollable electronic device.

BACKGROUND ART

In the related art, as a rollable electronic device including a display panel that is windable, a display device referred to as a rollable display device is known. As a winding mechanism of a display panel in a rollable display device, there is a technology disclosed in PTL 1.

A rollable display device disclosed in PTL 1 includes a flexible display panel (a display panel), a circuit substrate connected to an end of the display panel, and a roller (a support body) that winds the display panel. The roller has a cylindrical shape or a hollow tube shape. In addition, a guide hole extending along the length direction of the roller is formed in the roller.

Then, the rollable display device disclosed in PTL 1 includes a configuration where the display panel is wound by inserting the circuit substrate into the interior of the roller via the guide hole and rotating the roller.

CITATION LIST

Patent Literature

PTL 1: JP 2016-24460 A (published on Feb. 8, 2016)

SUMMARY

Technical Problem

When resolution of a rollable display device increases, the number of terminals for inputting signals increases. However, there is limitation in the number of signals that can be processed by one driver chip, and thus the rollable display device is driven by using a plurality of driver chips. In addition, an input of a signal for driving is performed by connecting a flexible cable including a wiring line to a terminal portion of the rollable display device by an anisotropic conductive film (ACF) or the like. Here, when a substrate size increases, it is not practical from the viewpoint of accuracy and a cost to connect one flexible cable to all terminal portions of the rollable display device. Thus, the rollable display device is driven by connecting a plurality of flexible cables divided for each drive chip. In a case where a size of a circuit substrate increases, there is a case where the circuit substrate is further divided into a plurality of substrate pieces.

For example, the plurality of substrate pieces are connected to the plurality of flexible cables, respectively, and each of the plurality of flexible cables is connected to a display panel via an anisotropic conductive film. Under such connection relationship, when the display panel wound around a support body is unwound, the plurality of flexible cables are pulled.

Here, it is very difficult to achieve parallel connection and an equal area of connection between each of the plurality of flexible cables and the display panel. In a case where there is no parallel connection or the area of the connection varies, there are the following problems when the display panel wound around the support body is unwound. That is, pulling force is applied to a certain flexible cable, and thus, the other flexible cable receives unexpected stress, and, as a result, a terminal portion connected to the other flexible cable receives an excessive load, and there is concern of significant damage to the terminal portion.

Solution to Problem

A rollable electronic device according to an aspect of the disclosure is a rollable electronic device including a rollable electronic component that is windable, and a plurality of flexible cables, wherein the rollable electronic component includes a functional region, a frame region surrounding the functional region, and a plurality of terminal portions provided at an end portion of the frame region, each of the plurality of flexible cables is connected to any of the plurality of terminal portions, and in the rollable electronic component, a first slit is formed between a first terminal portion and a second terminal portion that are two of the plurality of terminal portions, and the first slit separates the first terminal portion and the second terminal portion between the first terminal portion and the second terminal portion.

Advantageous Effects of Invention

According to an aspect of the disclosure, significant damage to a terminal portion can be suppressed.

ADVANTAGEOUS EFFECTS OF DISCLOSURE

Embodiments of the disclosure will be described below. Note that although an example where a rollable electronic device is a rollable display device will be described in each of the following embodiments, examples of realizing the rollable electronic device include an X-ray sensor and a pressure sensor in addition to the rollable display device. In addition, for convenience of description, a member including the same function as a function of a member having described will be denoted by the same reference sign, and description of such a member may not be repeated. Further, in the drawings, illustration of a member that obscures illustration of a feature point may be omitted.

First Embodiment

Figure 1:
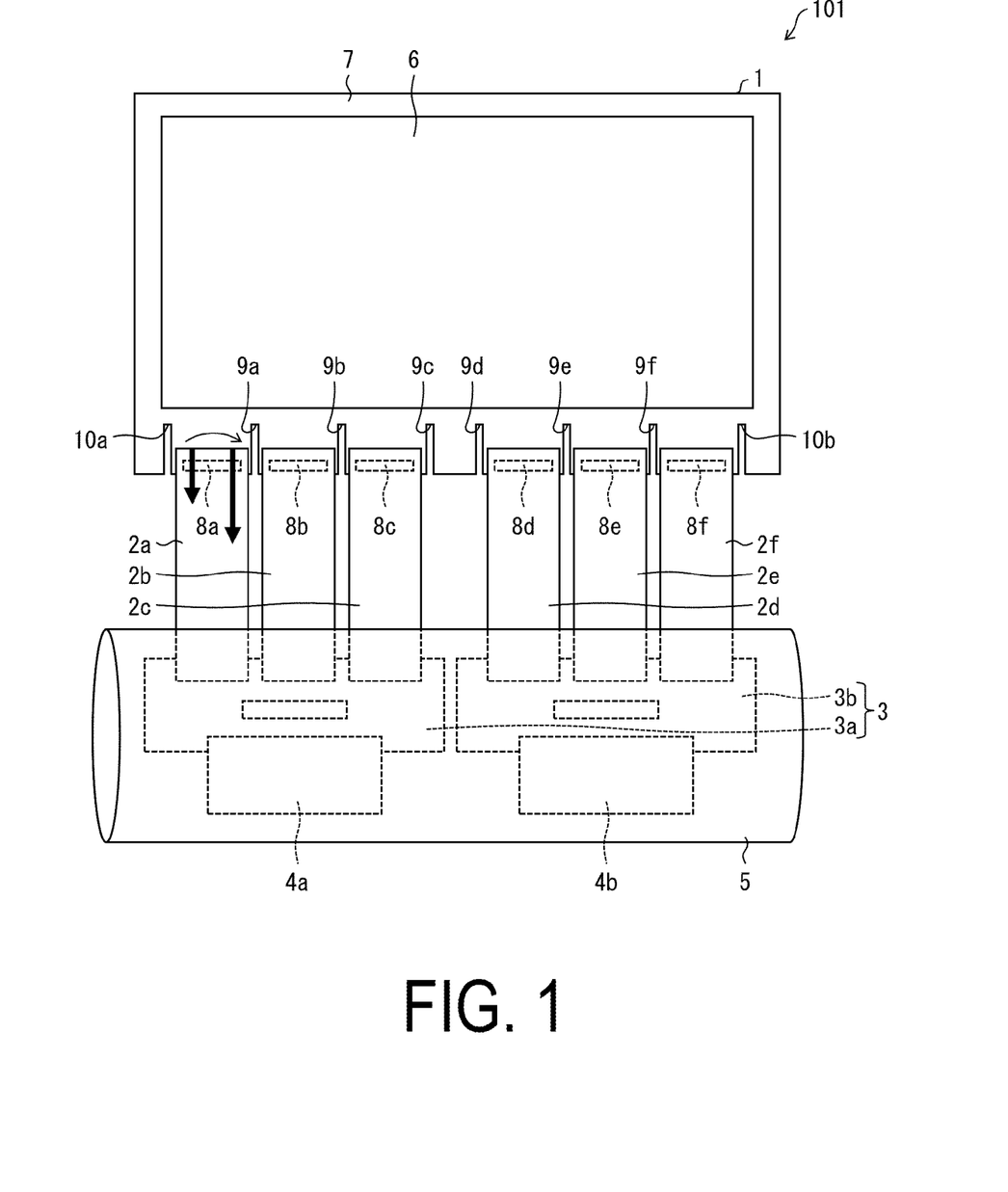
FIG. 1 is a plan view schematically illustrating a schematic configuration of a rollable display device according to a first embodiment of the disclosure.

FIG. 1 is a plan view illustrating a schematic configuration of a rollable display device (a rollable electronic device) 101 according to a first embodiment of the disclosure.

The rollable display device 101 includes a display panel (a rollable electronic component, a rollable display panel) 1, a plurality of flexible cables 2a to 2f, a circuit substrate 3, flexible substrates 4a and 4b, and a support body 5.

The display panel 1 is a rollable display panel that is windable, and the display panel 1 is flexible. The display panel 1 includes a display region (a functional region) 6, a frame region 7 surrounding the display region 6, and a plurality of terminal portions 8a to 8f provided at an end portion of the frame region 7. Note that in FIG. 1, the terminal portions 8a to 8f are hidden under the flexible cables 2a to 2f, respectively. Thus, in FIG. 1, each of the terminal portions 8a to 8f is illustrated by a dotted line. When the display panel 1 is housed, the display panel 1 and the flexible cables 2a to 2f are rolled and housed in a housing part (not illustrated). Similarly, in a state where the display panel 1 is unwound, the flexible cables 2a to 2f, the circuit substrate 3, the flexible substrates 4a and 4b, and the support body 5 other than the display panel 1 remain housed in the housing part.

Note that although in the above description, the housing part is provided in a lower side (the terminal portions 8a to 8f side), the housing part may be provided in an upper side. In that case, the flexible cables 2a to 2f, the circuit substrate 3, the flexible substrates 4a and 4b, and the support body 5 are housed in a circuit housing part (not illustrated). When the display panel 1 is housed, the display panel 1 is rolled and housed in the housing part (not illustrated) provided in the upper side, and the circuit housing part is not housed in the housing part.

Each of the flexible cables 2a to 2f is connected to any of the terminal portions 8a to 8f. In the rollable display device 101, the flexible cables 2a to 2f are connected to the terminal portions 8a to 8f, respectively. At least one of the terminal portions 8a to 8f may not be connected to any of the flexible cable 2a to 2f.

The circuit substrate 3 is divided into a plurality of pieces. In other words, the circuit substrate 3 includes a first substrate piece 3a that is a portion of the circuit substrate 3 and a second substrate piece 3b that is a portion of the circuit substrate 3. The first substrate piece 3a is connected to the flexible cables 2a to 2c, and the second substrate piece 3b is connected to the flexibles cables 2d to 2f. Note that it is not essential to divide the circuit substrate 3 into the plurality of pieces, in other words, the circuit substrate 3 may be a single substrate. In such a case, the circuit substrate 3 that is a single substrate is connected to the flexible cables 2a to 2f. In addition, in such a case, the flexible cables 2a to 2f may be divided into two or more groups, and the circuit substrate 3 that is a single substrate may be connected to each of the groups of the flexible cables 2a to 2f divided.

The flexible substrate 4a connects a drive circuit substrate or an external connection wiring line provided in the interior or the exterior of the rollable display device 101 and the first substrate piece 3a. The flexible substrate 4b connects a drive circuit substrate or an external connection wiring line provided in the interior or the exterior of the rollable display device 101 and the second substrate piece 3b. Illustration of the drive circuit substrate and the external connection wiring line is omitted.

The support body 5 has, for example, a cylindrical shape or a hollow tube shape. A guide hole (not illustrated) is formed in the support body 5. The rollable display device 101 is configured to wind the display panel 1 by inserting the circuit substrate 3 and the flexible substrates 4a and 4b into the interior of the support body 5 through the guide hole and rotating the support body 5.

A plurality of first slits 9a to 9f are formed in the display panel 1. Each of the first slits 9a to 9f is formed between a first terminal portion and a second terminal portion that are two terminal portions among the terminal portions 8a to 8f, and each of the first slits 9a to 9f separates the first terminal portion and the second terminal portion between the first terminal portion and the second terminal portion. For example, the first slit 9a is formed between the terminal portion 8a as the first terminal portion and the terminal portion 8b as the second terminal portion and separates the terminal portion 8a and the terminal portion 8b between the terminal portion 8a and the terminal portion 8b.

In a case where the first slits 9a to 9f are formed, when at least one of the flexible cables 2a to 2f is pulled at the time of unwinding the display panel 1 wound around the support body 5, the following action is exerted. That is, unexpected stress due to pulling force applied to the flexible cable connected to one of the first terminal portion and the second terminal portion on the flexible cable connected to the other of the first terminal portion and the second terminal portion can be mitigated. Thus, significant damage to the other of the first terminal portion and the second terminal portion can be suppressed.

In addition, two second slits 10a and 10b are formed in the display panel 1. With respect to the terminal portion 8a (an endmost terminal portion) provided at an end among the terminal portions 8a to 8f, the second slit 10a is formed in a side opposite to a side where the terminal portions 8b to 8f other than the terminal portion 8a are disposed. Accordingly, the stress described above on the flexible cable 2a can be mitigated, and thus significant damage to the terminal portion 8a can be suppressed. Similarly, with respect to the terminal portion 8f (an endmost terminal portion) provided at an end among the terminal portions 8a to 8f, the second slit 10b is formed in a side opposite to a side where the terminal portions 8a to 8e other than the terminal portion 8f are disposed. Accordingly, the stress described above on the flexible cable 2f can be mitigated, and thus significant damage to the terminal portion 8f can be suppressed.

In addition, the flexible cables 2a to 2f includes the flexible cables (first flexible cable) 2a to 2c connected to the first substrate piece 3a and the flexible cables (second flexible cable) 2d to 2f connected to the second substrate piece 3b. In addition, the terminal portions 8a to 8f include the terminal portions 8a to 8c connected to the flexible cables 2a to 2c, respectively, and the terminal portions 8d to 8f connected to the flexible cables 2d to 2f, respectively. Then, the plurality of first slits 9c and 9d are formed between the terminal portions 8a to 8c and the terminal portions 8d to 8f, more specifically, between the terminal portion 8c and the terminal portion 8d. In addition, in a case where a gap between two flexible cables adjacent to each other among the flexible cables 2a to 2f is large, the plurality of first slits may be formed between two terminal portions connected to the two flexible cables adjacent to each other among the terminal portions 8a to 8f. Accordingly, the effect described above of mitigating the stress increases.

Second Embodiment

Figure 2:
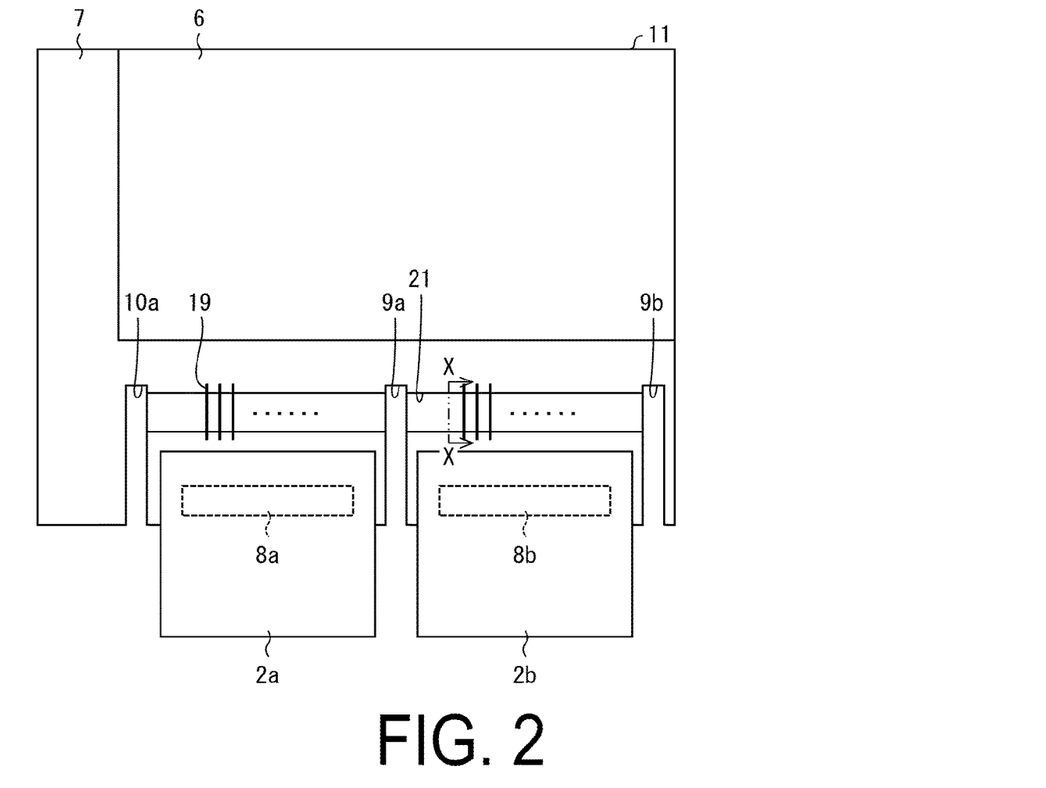
FIG. 2 is a plan view schematically illustrating a configuration of main portions of a display panel of a rollable display device according to a second embodiment of the disclosure.

FIG. 2 is a plan view schematically illustrating a configuration of main portions of a display panel 11 of a rollable display device according to a second embodiment of the disclosure. The rollable display device according to the second embodiment of the disclosure includes the same configuration as the configuration of the rollable display device 101 except that the display panel 11 is provided instead of the display panel 1.

Figure 3:
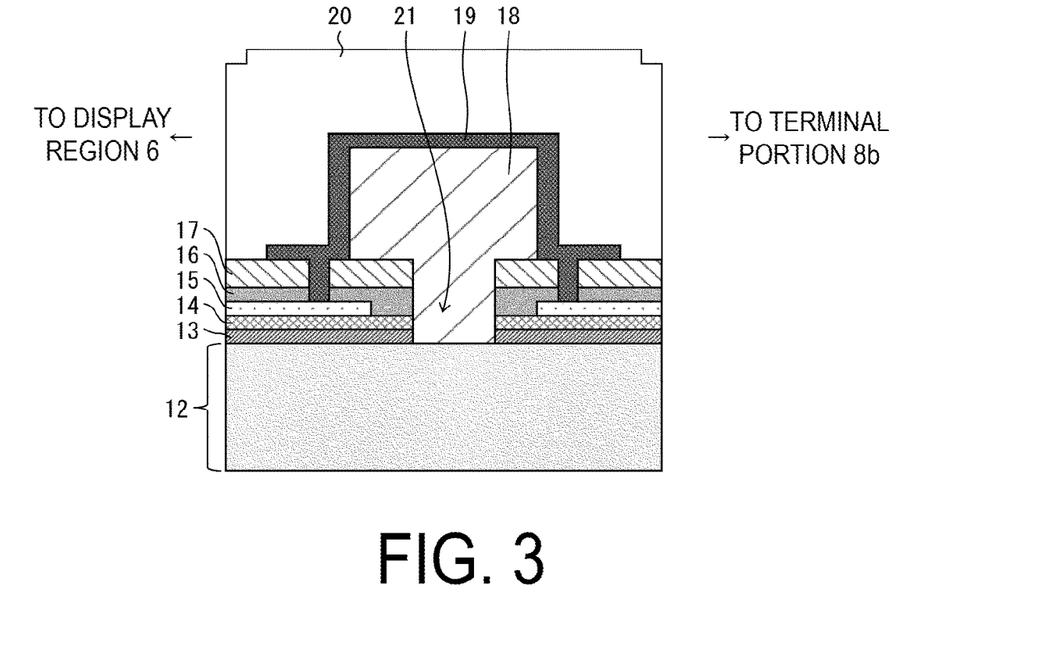
FIG. 3 is a cross-sectional view taken along line X-X of the display panel of the rollable display device according to the second embodiment of the disclosure.

FIG. 3 is a cross-sectional view taken along line X-X of the display panel 11. That is, FIG. 3 is a cross-sectional view taken along line X-X of FIG. 2.

The display panel 11 includes a resin substrate 12, a base coat film 13, a gate insulating film (an inorganic insulating film) 14, a gate wiring line 15, inorganic insulating films 16 and 17, a flattening film (a resin layer) 18, a source wiring line (a frame wiring line) 19, and a flattening film 20. The gate insulating film 14, the gate wiring line 15, and the inorganic insulating films 16 and 17 constitute main portions of a thin film transistor (TFT) layer. In addition, the display panel 11 includes a light-emitting element that is a constituent element of a display region 6 and that is provided on the resin substrate 12 via the TFT layer provided in the display region 6.

An example of a material of the resin substrate 12 includes polyimide. The base coat film 13 is a layer that prevents foreign matters such as water and oxygen from entering the TFT layer and the light-emitting element, and the base coat film 13 can include, for example, a silicon oxide film, a silicon nitride film, or a silicon oxynitride film that is formed by CVD, or a layered film of these films.

Each of the gate wiring line 15 and the source wiring line 19 includes, for example, a single layer film or a layered film of a metal including at least one of aluminum, tungsten, molybdenum, tantalum, chromium, titanium, and copper. Each of the inorganic insulating films 16 and 17 can include, for example, a silicon oxide (SiOx) film, or a silicon nitride (SiNx) film that is formed by CVD, or a layered film of these films.

Each of the flattening films 18 and 20 can include, for example, a coatable organic material such as polyimide and acrylic. Instead of the flattening film 20, an edge cover that defines a boundary of the light-emitting element may be used. The edge cover is formed by, for example, applying an organic material such as polyimide and acrylic and subsequently patterning the organic material by photolithography.

The source wiring line 19 is provided in a frame region 7, and is electrically connected to a wiring line provided in the display region 6, and is electrically connected to any terminal of terminal portions 8a to 8f. On line X-X of FIG. 2, the source wiring line 19 extends toward the terminal portion 8b. The inorganic insulating films 16 and 17 are provided in the frame region 7 and constitute the TFT layer.

Then, an opening 21 is formed in the base coat film 13, the gate insulating film 14, and the inorganic insulating films 16 and 17, and joins a plurality of first slits 9a and 9b adjacent to each other in the display region 6 side of the terminal portions 8a to 8f (the terminal portion 8b on line X-X). An upper face of the resin substrate 12 is a base of the opening 21.

Accordingly, an excessive load on the base coat film 13, the gate insulating film 14, and the inorganic insulating films 16 and 17 due to the stress described above can be suppressed, and thus, significant damage to the base coat film 13, the gate insulating film 14, and the inorganic insulating films 16 and 17 can be suppressed.

Further, the flattening film 18 fills the opening 21. Then, the source wiring line 19 is provided on the flattening film 18 and intersects the opening 21. Specifically, the opening 21 extends in a vertical direction with respect to the cross section illustrated in FIG. 3 (a vertical direction with respect to line X-X), and, on the other hand, the source wiring line 19 extends above the opening 21 in a direction parallel to the cross section illustrated in FIG. 3 (a direction parallel to line X-X).

The configuration of the display panel 1 and the configuration of the display panel 11 are the same except for the points described above.

Third Embodiment

Figure 4:
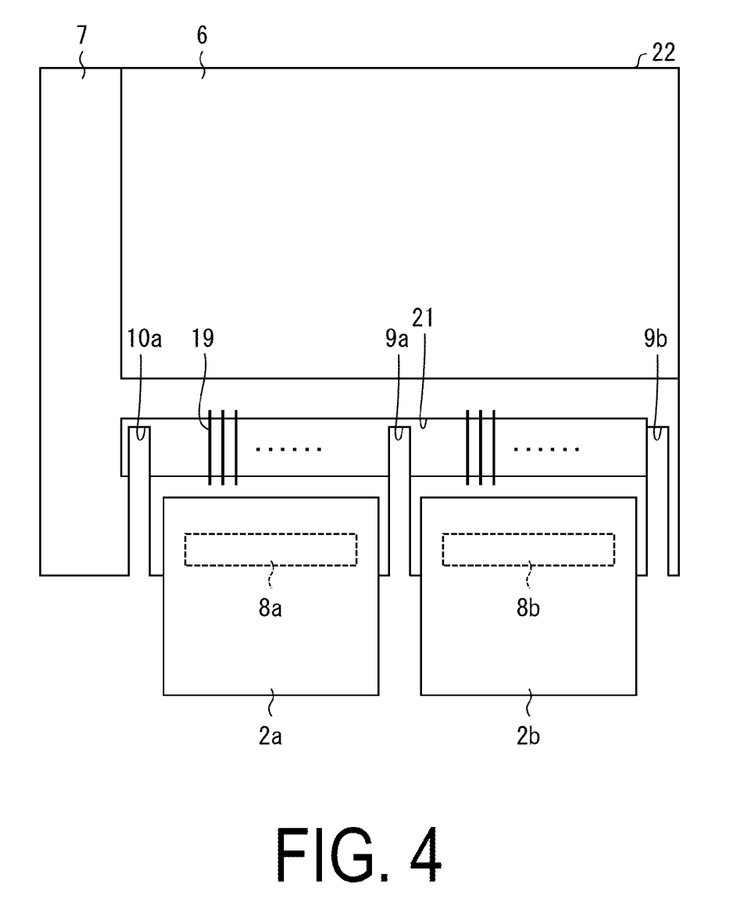
FIG. 4 is a plan view schematically illustrating a configuration of main portions of a display panel of a rollable display device according to a third embodiment of the disclosure.

FIG. 4 is a plan view schematically illustrating a configuration of main portions of a display panel 22 of a rollable display device according to a third embodiment of the disclosure. The rollable display device according to the third embodiment includes the same configuration as the configuration of the rollable display device according to the second embodiment of the disclosure except that the display panel 22 is provided instead of the display panel 11.

An opening 21 of the display panel 22 extends to a display region 6 side over end portions in the display region 6 side of first slits 9a and 9b. In other words, the opening 21 of the display panel 22 is formed from between the first slits 9a and 9b adjacent to each other to the display region 6 side.

Stress is likely to concentrate in a shaped portion such as an end portion in the display region 6 side in each of the first slits 9a and 9b, but, accordingly, an excessive load on a base coat film 13, a gate insulating film 14, and inorganic insulating films 16 and 17 can further be suppressed, and thus, significant damage to the base coat film 13, the gate insulating film 14, and the inorganic insulating films 16 and 17 can further be suppressed.

The configuration of the display panel 11 and the configuration of the display panel 22 are the same except for the points described above.

Figure 5:
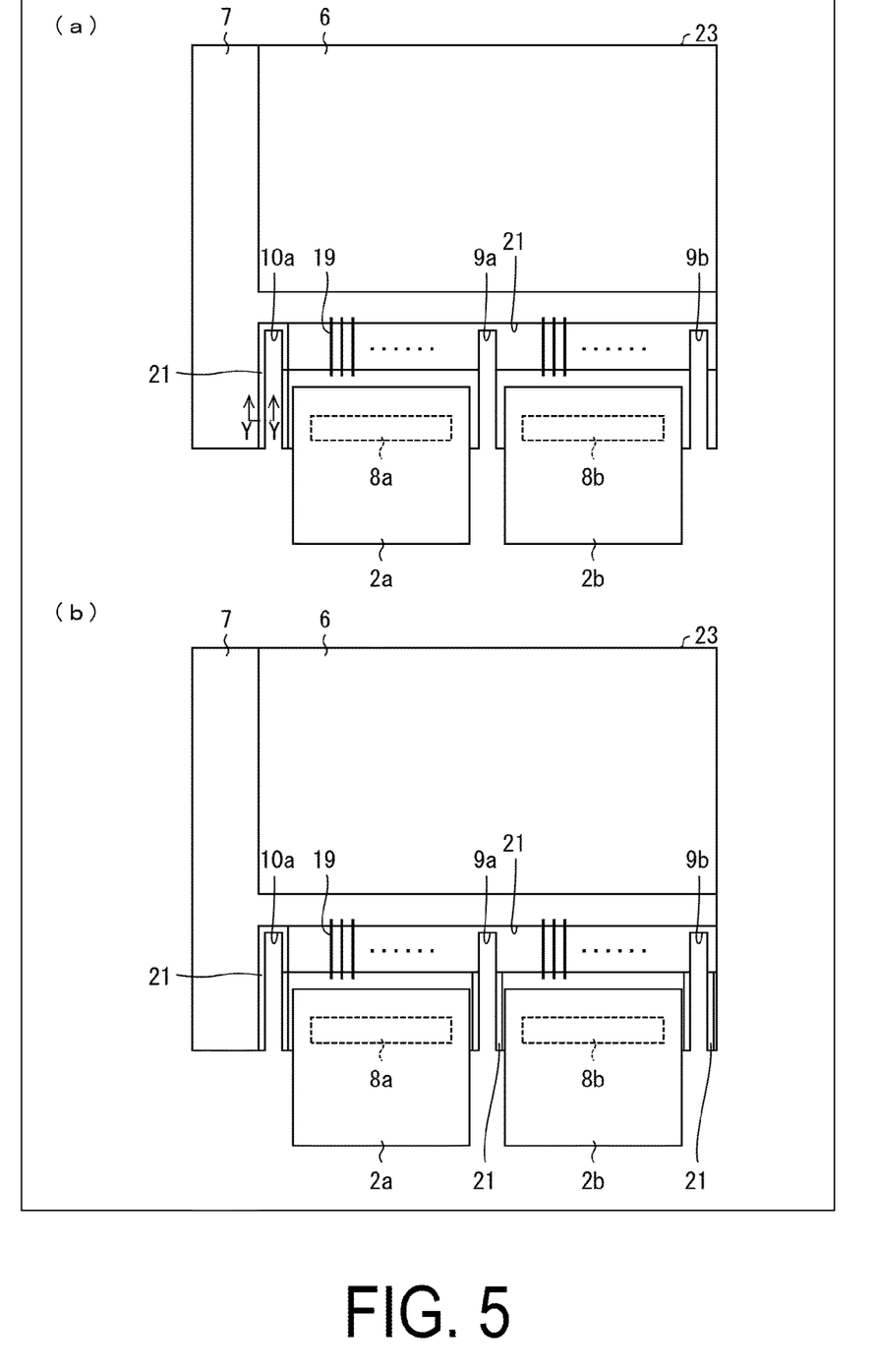
FIGS. 5(a) and 5(b) are each a plan view schematically illustrating a configuration of main portions of a display panel of a rollable display device according to a fourth embodiment of the disclosure.

Fourth Embodiment (a) and (b) of FIG. 5 are each a plan view schematically illustrating a configuration of main portions of a display panel 23 of a rollable display device according to a fourth embodiment of the disclosure. The rollable display device according to the fourth embodiment includes the same configuration as the configuration of the rollable display device according to the third embodiment of the disclosure except that the display panel 23 is provided instead of the display panel 22.

Figure 6:
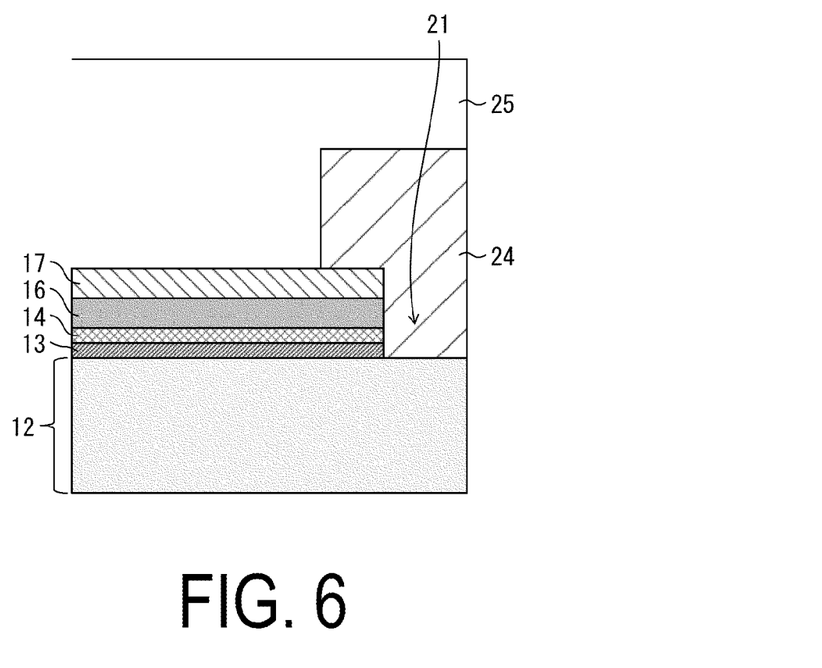
FIG. 6 is a cross-sectional view taken along line Y-Y of the display panel of the rollable display device according to the fourth embodiment of the disclosure.

FIG. 6 is a cross-sectional view taken along line Y-Y of the display panel 23. That is, FIG. 6 is a cross-sectional view taken along line Y-Y of (a) of FIG. 5.

As illustrated in (a) of FIG. 5, an opening 21 of the display panel 23 is formed and surrounds a second slit 10a. In other words, the opening 21 of the display panel 23 is formed along two sides in the longitudinal direction and one side in the short-hand direction of the second slit 10a.

As illustrated in FIG. 6, for example, at or near the one side in the longitudinal direction of the second slit 10a, the opening 21 is filled with a flattening film (a resin layer) 24. In addition, a flattening film 25 is layered on the flattening film 24. A material constituting the flattening film 24 and a material constituting the flattening film 25 may be the same as the material constituting the flattening film 18 and the material constituting the flattening film 20, respectively. The flattening film 24 and the flattening film 25 are formed by the same processes as the process of forming the flattening film 18 and the flattening film 20. Note that a gate wiring line 15 and a source wiring line 19 are not provided in the cross section illustrated in FIG. 6, and it is because the cross section is not a portion provided with a wiring line.

Accordingly, a size of the opening 21 can be increased. Thus, an excessive load on inorganic insulating films 16 and 17 due to the stress describe above can further be suppressed, and thus, significant damage to the inorganic insulating films 16 and 17 can further be suppressed.

Note that in a manner similar to the manner of (a) of FIG. 5, the opening 21 of the display panel 23 may be formed and surround a second slit 10b. In this case, the opening 21 of the display panel 23 is formed along two sides in the longitudinal direction and one side in the short-hand direction of the second slit 10b. In addition, as illustrated in (b) of FIG. 5, the opening 21 of the display panel 23 may be formed and surround at least one of first slits 9a to 9f. In this case, the opening 21 of the display panel 23 is formed along two sides in the longitudinal direction and one side in the short-hand direction of the at least one of the first slits 9a to 9f.

The configuration of the display panel 22 and the configuration of the display panel 23 are the same except for the points described above.

Fifth Embodiment

As a rollable display device according to a fifth embodiment of the disclosure, the following configuration can be applied in the rollable display device according to any of the first to fourth embodiments of the disclosure.

Figure 7:
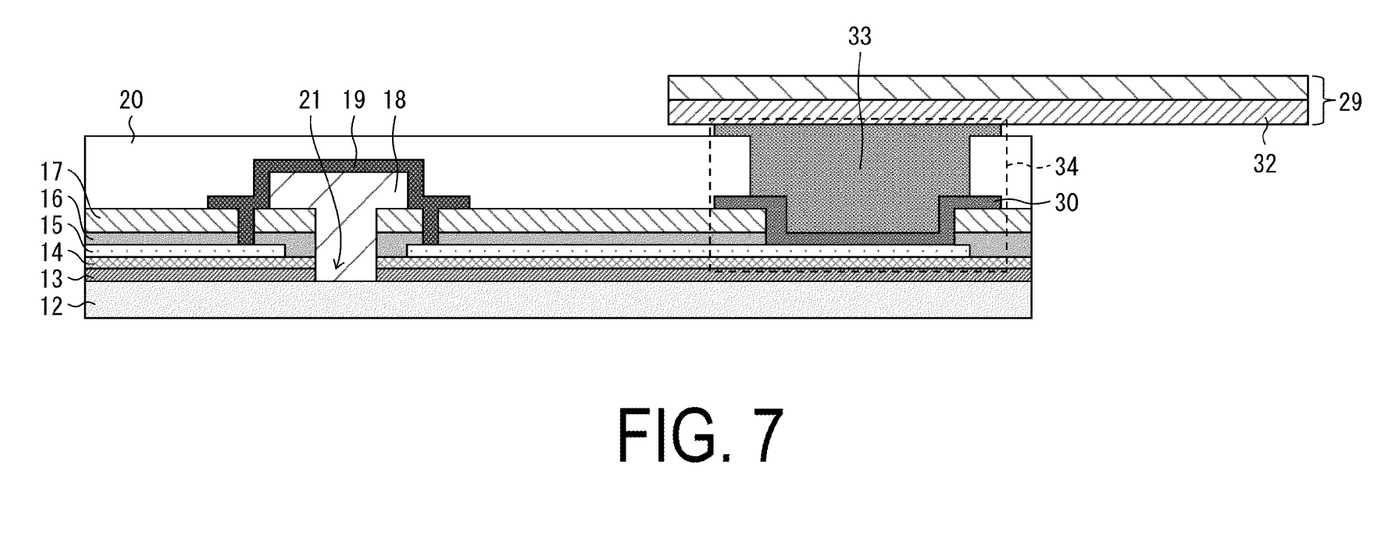
FIG. 7 is a simplified cross-sectional view of a configuration of main portions of a rollable display device according to a fifth embodiment of the disclosure.

FIG. 7 is a simplified cross-sectional view of a configuration of main portions of the rollable display device according to the fifth embodiment of the disclosure. For simplification of description, in FIG. 7, illustration is appropriately omitted. In addition, in FIG. 7, a member corresponding to any of flexible cables 2a to 2f is a flexible cable 29, and a member corresponding to any of terminal portions 8a to 8f is a terminal portion 30.

A wiring line 32 provided in the flexible cable 29 and the terminal portion 30 are connected via an anisotropic conductive film 33. Even in a case where an opening 21 is formed, in a connection section 34 where the connection via the anisotropic conductive film 33 is made, an inorganic insulating film (at least a gate insulating film 14 in FIG. 7) is preferably provided. Accordingly, strength of the terminal portion 30 and in a periphery of the terminal portion 30 that is sufficient for making the connection via the anisotropic conductive film 33 can be realized, and thus, the connection via the anisotropic conductive film 33 can be made stably.

Additional Items

The rollable display device according to each embodiment is not particularly limited as long as the rollable display device includes a display panel that has flexibility and that is bendable. As a type of the light-emitting element, there are a display element having luminance or transmittance controlled by a current, and a display element having luminance or transmittance controlled by a voltage. As the current-controlled display element, there is an organic electroluminescence (EL) display including an organic light emitting diode (OLED), a quantum dot light emitting diode (QLED) display including an EL display QLED such as an inorganic EL display including an inorganic light emitting diode, or the like. In addition, as the voltage-controlled display element, there is a liquid crystal display element or the like. In other words, each of the display panels 1, 11, 22, and 23 may be an organic EL panel or may be any other display panel.

Supplement

A rollable electronic device according to aspect 1 of the disclosure is a rollable electronic device including a rollable electronic component that is windable, and a plurality of flexible cables, wherein the rollable electronic component includes a functional region, a frame region surrounding the functional region, and a plurality of terminal portions provided at an end portion of the frame region, each of the plurality of flexible cables is connected to any of the plurality of terminal portions, and in the rollable electronic component, a first slit is formed between a first terminal portion and a second terminal portion that are two of the plurality of terminal portions, and the first slit separates the first terminal portion and the second terminal portion between the first terminal portion and the second terminal portion.

According to the configuration described above, when at least one of the plurality of flexible cables is pulled at the time of unwinding the rollable electronic component wound around the support body, the following action is exerted. That is, unexpected stress due to pulling force applied to the flexible cable connected to one of the first terminal portion and the second terminal portion on the flexible cable connected to the other of the first terminal portion and the second terminal portion can be mitigated. Accordingly, significant damage to the other of the first terminal portion and the second terminal portion can be suppressed.

The rollable electronic device according to aspect 2 of the disclosure is the rollable electronic device according to aspect 1 described above, wherein the first terminal portion and the second terminal portion are adjacent to each other, and each of the first terminal portion and the second terminal portion is connected to any of the plurality of flexible cables, and the first slit is formed between the first terminal portion and the second terminal portion.

The rollable electronic device according to aspect 3 of the disclosure is the rollable electronic device according to aspect 1 or 2 described above, wherein, with respect to an endmost terminal portion provided at an end among the plurality of terminal portions, a second slit is formed in a side opposite to a side where the terminal portions other than the endmost terminal portion are disposed.

According to the configuration described above, the stress described above on the flexible cable connected to the endmost terminal portion can be mitigated, and thus, significant damage to the endmost terminal portion can be suppressed.

The rollable electronic device according to aspect 4 of the disclosure is the rollable electronic device according to any one of aspects 1 to 3 described above, including a circuit substrate including a plurality of substrate pieces including a first substrate piece and a second substrate piece, wherein the plurality of flexible cables include a first flexible cable connected to the first substrate piece and a second flexible cable adjacent to the first flexible cable and connected to the second substrate piece, the plurality of terminal portions include a terminal portion connected to the first flexible cable and a terminal portion connected to the second flexible cable, and a plurality of the first slits are formed between the terminal portion connected to the first flexible cable and the terminal portion connected to the second flexible cable.

According to the configuration described above, the effect of mitigating stress by the formation of the first slit increases.

The rollable electronic device according to aspect 5 of the disclosure is the rollable electronic device according to any one of aspects 1 to 4 described above, wherein the plurality of first slits are formed, the rollable electronic component includes a resin substrate, a TFT layer provided in the functional region of the resin substrate, a frame wiring line provided in the frame region, and electrically connected to a wiring line provided in the functional region, and electrically connected to any terminal of the plurality of terminal portions, and at least one inorganic insulating film provided in the frame region and constituting the TFT layer, and an opening is formed in the inorganic insulating film and joins the plurality of first slits adjacent to each other in a functional region side of the plurality of terminal portions.

According to the configuration described above, an excessive load on the inorganic insulating film due to the stress described above can be suppressed, and thus, significant damage to the inorganic insulating film can be suppressed.

The rollable electronic device according to aspect 6 of the disclosure is the rollable electronic device according to aspect 5 described above, including a resin layer filling the opening, wherein the frame wiring line is provided on the resin layer and intersects the opening.

The rollable electronic device according to aspect 7 of the disclosure is the rollable electronic device according to aspect 5 or 6 described above, wherein the opening is formed from between the plurality of first slits adjacent to each other to the functional region side.

Stress is likely to concentrate in a shaped portion such as an end portion in the functional region side in each first slit, but according to the configuration described above, an excessive load on the inorganic insulating film can further be suppressed, and thus, significant damage to the inorganic insulating film can further be suppressed.

The rollable electronic device according to aspect 8 of the disclosure is the rollable electronic device according to any one of aspects 5 to 7, wherein, with respect to an endmost terminal portion provided at an end among the plurality of terminal portions, a second slit is formed in a side opposite to a side where the terminal portions other than the endmost terminal portion are disposed, and the opening is formed and surrounds the second slit.

The rollable electronic device according to aspect 9 of the disclosure is the rollable electronic device according to any one of aspects 5 to 8 described above, wherein the opening is formed and surrounds the first slit.

According to the configuration described above, a size of the opening can be increased. Thus, an excessive load on the inorganic insulating film due to the stress described above can further be suppressed, and thus, significant damage to the inorganic insulating film can further be suppressed.

The rollable electronic device according to aspect 10 of the disclosure is the rollable electronic device according to aspect 8 or 9 described above, wherein an inorganic insulating film is provided in a connection section of any of the plurality of flexible cables and any of the plurality of terminal portions.

According to the configuration described above, strength of the terminal portion and in a periphery of the terminal portion that is sufficient for making connection in the connection section can be realized, and thus, this connection can be made stably.

The rollable electronic device according to aspect 11 of the disclosure is the rollable electronic device according to any one of aspects 1 to 10 described above, wherein the rollable electronic component is a rollable display panel, and the functional region is a display region.

The rollable electronic device according to aspect 12 of the disclosure is the rollable electronic device according to aspect 11 described above, including a light-emitting element that is a constituent element of the display region and that is provided via a TFT layer provided in the display region.

The rollable electronic device according to aspect 13 of the disclosure is the rollable electronic device according to aspect 11 or 12 described above, wherein the rollable display panel is an organic EL panel.

According to the configuration described above, in a rollable electronic device (a so-called rollable display device) including a rollable display panel that is windable as a rollable electronic component, an effect similar to the effect of the rollable electronic device according to each aspect of the disclosure is exhibited.

The disclosure is not limited to each of the embodiments described above, and various modifications can be made within the scope of the claims. An embodiment obtained by appropriately combining the technical approaches disclosed in each of the different embodiments also falls within the technical scope of the disclosure. Further, a novel technical feature can be formed by combining the technical approaches disclosed in each of the embodiments.

The invention claimed is:
1. A rollable electronic device comprising:
   a rollable electronic component that is windable; and
   a plurality of flexible cables,
   wherein the rollable electronic component includes a functional region, a frame region surrounding the functional region, and a plurality of terminal portions provided at an end portion of the frame region,
   each of the plurality of flexible cables is connected to at least one of the plurality of terminal portions,
   in the rollable electronic component, a first slit is formed between a first terminal portion and a second terminal portion that are two of the plurality of terminal portions, and the first slit separates the first terminal portion and the second terminal portion between the first terminal portion and the second terminal portion,
   a plurality of first slits, including the first slit, is formed,
   the rollable electronic component further includes:
   a resin substrate,
   a thin-film transistor (TFT) layer provided in the functional region of the resin substrate,
   a frame wiring line provided in the frame region, and electrically connected to a wiring line provided in the functional region, and also electrically connected to at least one of the plurality of terminal portions, and
   at least one inorganic insulating film provided in the frame region and forming the TFT layer, and
   an opening is formed in the inorganic insulating film and joins the plurality of first slits adjacent to each other in a functional region side of the plurality of terminal portions.
2. The rollable electronic device according to claim 1, wherein the first terminal portion and the second terminal portion are adjacent to each other, and
   each of the first terminal portion and the second terminal portion is connected to at least one of the plurality of flexible cables, and
   the first slit is formed between the first terminal portion and the second terminal portion.

3. The rollable electronic device according to claim 1,
wherein, with respect to an endmost terminal portion provided at an end position, among the plurality of terminal portions, a second slit is formed in a side opposite a side where the plurality of terminal portions other than the endmost terminal portion is disposed.

4. The rollable electronic device according to claim 1, further comprising:
a circuit substrate including a plurality of substrate pieces including a first substrate piece and a second substrate piece,
wherein the plurality of flexible cables includes a first flexible cable connected to the first substrate piece and a second flexible cable adjacent to the first flexible cable and connected to the second substrate piece,
the plurality of terminal portions includes a terminal portion connected to the first flexible cable and a terminal portion connected to the second flexible cable, and
the plurality of the first slits is formed between the terminal portion connected to the first flexible cable and the terminal portion connected to the second flexible cable.

5. The rollable electronic device according to claim 1, further comprising:
a resin layer filling the opening,
wherein the frame wiring line is provided on the resin layer and intersects the opening.

6. The rollable electronic device according to claim 1,
wherein the opening is formed from between the plurality of first slits adjacent to each other to the functional region side.

7. The rollable electronic device according to claim 1,
wherein, with respect to an endmost terminal portion, provided at an end position, among the plurality of terminal portions, a second slit is formed in a side opposite a side where the plurality of terminal portions other than the endmost terminal portion is disposed, and
the opening is formed and surrounds the second slit.

8. The rollable electronic device according to claim 7,
wherein an inorganic insulating film is provided in a connection section connecting at least one of the plurality of flexible cables to at least one of the plurality of terminal portions.

9. The rollable electronic device according to claim 1,
wherein the opening is formed and surrounds the first slit.

10. The rollable electronic device according to claim 1,
wherein the rollable electronic component is a rollable display panel, and the functional region is a display region.

11. The rollable electronic device according to claim 10, further comprising:
a light-emitting element that is a constituent element of the display region and that is provided via a TFT layer provided in the display region.

12. The rollable electronic device according to claim 10,
wherein the rollable display panel is an organic electroluminescent (EL) panel.

* * * * *